United States Patent [19]
Voorman

[11] Patent Number: 4,926,135
[45] Date of Patent: May 15, 1990

[54] BALANCED INTEGRATOR-FILTER ARRANGEMENT

[75] Inventor: Johannes O. Voorman, Eindhoven, Netherlands

[73] Assignee: U.S. Philips Corporation, New York, N.Y.

[21] Appl. No.: 361,612

[22] Filed: Jun. 2, 1989

[30] Foreign Application Priority Data

Jun. 8, 1988 [NL] Netherlands ............... 8801469

[51] Int. Cl.$^5$ ............................................. H03F 1/34
[52] U.S. Cl. .................................. 330/107; 330/294; 330/306
[58] Field of Search ................ 330/69, 107, 109147, 330/148, 294, 302, 306

[56] References Cited

U.S. PATENT DOCUMENTS

| | | | |
|---|---|---|---|
| 4,509,019 | 4/1985 | Banu et al. | 330/107 |
| 4,780,690 | 10/1988 | Voorman | 330/294 |
| 4,786,880 | 11/1988 | Voorman | 330/294 |

FOREIGN PATENT DOCUMENTS

1948130 3/1971 Fed. Rep. of Germany.

Primary Examiner—Steven Mottola
Attorney, Agent, or Firm—Bernard Franzblau

[57] ABSTRACT

An active RC filter arrangement consists of a balanced amplifier ($A_1$) in combination with various resistors and capacitors and which can be extended to obtain an $n^{th}$-order filter arrangement. Once a general $n^{th}$-order filter arrangement has been created it can be modified to obtain various special purpose filters, such as a low-pass, a high-pass or an all-pass $n^{th}$-order active RC filter, by merely changing the values of the resistors and capacitors.

21 Claims, 15 Drawing Sheets

BALANCED INTEGRATOR-FILTER ARRANGEMENT

BACKGROUND OF THE INVENTION

This invention relates to a filter arrangement comprising a first balanced amplifier having a non-inverting and an inverting input and having a non-inverting and an inverting output, a first and a second input terminal, a first and a second output terminal, a first and a second feedback circuit, each comprising a first capacitor, the first feedback circuit being arranged between the inverting output and the non-inverting input of the first amplifier, and the second feedback circuit being arranged between the non-inverting output and the inverting input of the first amplifier, a first and a second input circuit, each comprising the parallel arrangement of a first resistor and the second capacitor, the first input circuit being arranged between the first input terminal and the non-inverting input of the first amplifier and the second input circuit being arranged between the second input terminal and the inverting input of the first amplifier, a connection between the inverting output of the first amplifier and the second output terminal and a connection between the non-inverting output of the first amplifier and the first output terminal.

Such a filter arrangement is very suitable for realising active RC filters comprising balanced amplifiers.

Active RC filters comprising a balanced amplifier are known from U.S. Pat. No. 4,509,019. This patent describes the basic principle of an active RC filter comprising a balanced amplifier. Moreover, said patent reveals some filter types based on said principle including a first-order low-pass filter (FIG. 3). There are several known methods of designing a filter having specific desired characteristics. A frequently employed method is that in which lower-order filter sections are cascaded. It is common practice to employ first-order and second-order sections for this purpose. Section orders higher than four are hardly ever used because such sections are difficult to realise. A filter arrangement of a type as defined in the opening paragraph is known from the article "New Structures for MOSFET-C Filters", Proceedings of the IEEE, Vol. 75, No. 7, July 1987, page 957. This article describes how difficult it may be to translate known filter designs into versions comprising balanced amplifiers. Said article proposes three different second-order filter sections comprising balanced amplifiers. A disadvantage of these known filter circuits is that only second-order filters are mentioned and that neither of the filters is suitable for realising all the filter operations which are customary and possible for said order without thoroughly modifying the circuit configuration, i.e. without changing the interconnections between the filter elements and, sometimes, the positions of the inputs and outputs of the network. For this reason the systematic design of active RC filters comprising balanced amplifiers is a difficult task.

SUMMARY OF THE INVENTION

Therefore, it is on the object of the invention to provide filter circuits by means of which first-order and higher-order active RC filters can be realised simply.

According to the invention a filter arrangement of a type defined in the opening paragraph is characterized in that the filter arrangement also comprises a third and a fourth input circuit, each comprising a third capacitor, the third input circuit being arranged between the first input terminal and the inverting input of the first amplifier, and the fourth input circuit being arranged between the second input terminal and the non-inverting input of the first amplifier.

This filter arrangement constitutes the elementary configuration which serves as a basis for realising first-order and higher-order filter arrangements, enabling active RC filters of a specific order for substantially every possible filter function to be realised by merely changing the values of resistors and capacitors.

A first embodiment of a filter arrangement in accordance with the invention is characterized in that the filter arrangement also comprises a first and a second coupling circuit, each comprising a second resistor, the first coupling circuit being arranged between the non-inverting input of the first amplifier and the inverting output of the first amplifier, and the second coupling circuit being arranged between the inverting input of the first amplifier and the non-inverting output of the first amplifier.

The addition of two network elements yields a general first-order filter arrangement. Filter arrangements having special characteristics are obtained by an appropriate choice of the values of the filter elements.

A further embodiment is characterized in that the capacitance values of the second capacitors in the first and the second input circuit are substantially zero, in that the capacitance values of the third capacitors in the third and the fourth input circuit and the first capacitors in the first and the second feedback circuit are substantially equal, and in that the conductance values of the first resistors in the first and second input circuit and the second resistors in the first and second coupling circuit are substantially equal. This yields a first-order all-pass network.

Another embodiment is characterized in that the conductance values of the first resistors in the first and the second input circuit are substantially zero and in that the capacitance values of the third capacitors in the third and the fourth input circuit are substantially zero. Thus the arrangement constitutes a high-pass network.

By extending the elementary configuration, a second embodiment of a filter arrangement in accordance with the invention is obtained, which is characterized in that the filter arrangement also comprises a second balanced amplifier having a non-inverting and an inverting input and having a non-inverting and an inverting output, a fifth and a sixth input circuit each comprising a fourth capacitor, the fifth input circuit being arranged between the first input terminal and the non-inverting input of the second amplifier, and the sixth input circuit being arranged between the second input terminal and the inverting input of the second amplifier, a seventh and an eighth input circuit, each comprising a third resistor, the seventh input circuit being arranged between the non-inverting output of the first amplifier and the non-inverting input of the second amplifier, and the eighth input circuit being arranged between the inverting output of the first amplifier and the inverting input of the second amplifier, a third and a fourth feedback circuit, each comprising a fifth capacitor, the third feedback circuit being arranged between the inverting output and the non-inverting input of the second amplifier, and the fourth feedback circuit being arranged between the non-inverting output and the inverting input of the second amplifier, a first and a second coupling circuit, each comprising a second resistor, the first coupling circuit being arranged between the non-inverting input of the first amplifier and a first node, and the second coupling circuit being arranged between the inverting input of the first amplifier and a second node, a third and a fourth coupling circuit, each comprising a fourth resistor, the third coupling circuit being arranged between the first node and the non-inverting input of the second amplifier, and the fourth coupling circuit being arranged between the second node and the inverting input of the second amplifier.

A modification thereof constitutes a general second-order filter arrangement which, in accordance with the invention is characterized in that the first node and the inverting output of the second amplifier and a fourth output terminal are interconnected, and in that the second node and the non-inverting output of the second amplifier and a third output terminal are interconnected. Special embodiments of the second-order filter arrangement are obtained by varying the values of the resistors and the capacitors.

In a further embodiment a low-pass filter is obtained if the arrangement is characterized in that the capacitance values of the second capacitors in the first and the second input circuit and of the third capacitors in the third and the fourth input circuit and of the fourth capacitors in the fifth and the sixth input circuit are substantially zero.

A high-pass filter is obtained if the conductance values of the first resistors in the first and the second input circuit are substantially zero and the capacitance values of the third capacitors in the third and the fourth input circuit are substantially zero.

A band-rejection filter, also referred to as a "notch filter", is obtained if the capacitance values of the second capacitors in the first and the second input circuit and of the third capacitors in the third and the fourth input circuit are substantially zero.

An embodiment having the characteristics of an all-pass network is characterized in that the capacitance values of the second capacitors in the first and second input circuit are substantially zero, in that the conductance values of the first resistors in the first and the second input circuit and of the second resistor in the first and the second coupling circuit are substantially equal, in that the conductance values of the third resistors in the seventh and the eighth input circuit and of the fourth resistors in the third and the fourth coupling circuit are substantially equal, in that the capacitance values of the third capacitors in the third and the fourth input circuit and of the first capacitors in the first and the second feedback circuit are substantially equal, and in that the capacitance values of the fourth capacitors in the fifth and the sixth input circuit and of the fifth capacitors in the third and the fourth feedback circuit are substantially equal.

A band-pass filter is obtained if the conductance values of the first resistors in the first and the second input circuit are substantially zero and the capacitance values of the third capacitors in the third and the fourth input circuit and of the fourth capacitors in the fifth and the sixth input circuit are substantially zero.

A further extension of the elementary configuration yields a third embodiment of a filter arrangement in accordance with the invention which is characterized in that the filter arrangement also comprises a third balanced amplifier having a non-inverting and an inverting input and having a non-inverting and an inverting output, a fifth and a sixth output terminal, a ninth and a tenth input circuit, each comprising a sixth capacitor, the ninth input circuit being arranged between the first input terminal and the non-inverting input of the third amplifier, and the tenth input circuit being arranged between the second input terminal and the inverting input of the third amplifier, an eleventh and a twelfth input circuit, each comprising a seventh capacitor, the eleventh input circuit being arranged between the first input terminal and the inverting input of the third amplifier, and the twelfth input circuit being arranged between the second input terminal and the non-inverting input of the third amplifier, a thirteenth and a fourteenth input circuit, each comprising a fifth resistor, the thirteenth input circuit being arranged between the inverting output of the second amplifier and the inverting input of the third amplifier, and the fourteenth input circuit being arranged between the non-inverting output of the second amplifier and the non-inverting input of the third amplifier, a fifth and a sixth coupling circuit, each comprising a sixth resistor, the fifth coupling circuit being arranged between the first node and the non-inverting input of the third amplifier, and the sixth coupling circuit being arranged between the second node and the inverting input of the third amplifier, a fifth and a sixth feedback circuit, each comprising an eighth capacitor, the fifth feedback circuit being arranged between the non-inverting input and the inverting output of the third amplifier, and the sixth feedback circuit being arranged between the inverting input and the non-inverting output of the third amplifier, and in that the inverting output of the third amplifier is connected to the sixth output terminal and the non-inverting output of the third amplifier is connected to the fifth output terminal.

A further embodiment constitutes a general third-order filter arrangement, characterized in that the first node is connected to the inverting output of the third amplifier and the second node is connected to the non-inverting output of the third amplifier.

Special filter arrangements can be obtained by varying the values of the resistors and capacitors. A low-pass filter arrangement is obtained if in the general third-order filter arrangement the capacitance values of the second capacitors in the first and the second input circuit, of the third capacitors in the third and the fourth input circuit, of the fourth capacitors in the fifth and the sixth input circuit, of the sixth capacitors in the ninth and the tenth input circuit, and of the seventh capacitors in the eleventh and the twelfth input circuit are substantially zero.

A high-pass filter is obtained if the conductance values of the first resistors in the first and the second input circuit are substantially zero and the capacitance values of the third capacitors in the third and the fourth input circuit and of the seventh capacitors in the eleventh and the twelfth input circuit are substantially zero.

A filter having a transmission zero point is formed by an arrangement which is characterized in that the conductance values of the first resistors in the first and the second input circuit and of the fifth resistors in the thirteenth and the fourteenth input circuit are substantially equal, in that the product of the capacitance values of the second capacitors in the first and the second input circuit and of the fourth capacitors in the fifth and the sixth input circuit is substantially equal to the product of the capacitance values of the fifth capacitors in the third and the fourth feedback circuit and of the sixth capacitors in the ninth and the tenth input circuit, and in that the capacitance values of the third capacitors in the third and the fourth input circuit and of the seventh capacitors in the eleventh and the twelfth input circuit are substantially zero.

An all-pass network is obtained if the conductance values of the first resistors in the first and the second input circuit and of the second resistors in the first and the second coupling circuit are substantially equal, the conductance values of the third resistors in the seventh and the eighth input circuit and of the fourth resistors in the third and the fourth coupling circuit are substantially equal, the conductance values of the fifth resistors in the thirteenth and the fourteenth input circuit and the sixth resistors in the fifth and of the sixth coupling circuit are substantially equal, in that the capacitance values of the second capacitors in the first and the second input circuit and of the sixth capacitors in the ninth and the tenth input circuit are substantially zero, in that the capacitance values of the third capacitors in the third and the fourth input circuit and of the first capacitors in the first and the second feedback circuit are substantially equal, the capacitance values of the fourth capacitors in the fifth and the sixth input circuit and of the fifth capacitors in the third and the fourth feedback circuit are substantially equal, and the capacitance values of the seventh capacitors in the eleventh and the twelfth input circuit and of the eighth capacitors in the fifth and in the sixth feedback circuit are substantially equal.

Yet another extension of the elementary configuration results in a fourth embodiment of a filter arrangement in accordance with the invention, which is characterized in that the filter arrangement also comprises a fourth balanced amplifier having a non-inverting input and an inverting input and having a non-inverting output and an inverting output, a seventh and an eighth output terminal, a fifteenth and a sixteenth input circuit, each comprising a ninth capacitor, the fifteenth input circuit being arranged between the first input terminal and the non-inverting input of the fourth amplifier and the sixteenth input circuit being arranged between the second input terminal and the inverting input of the fourth amplifier, a seventeenth and an eighteenth input circuit, each comprising a seventh resistor, the seventeenth input circuit being arranged between the non-inverting output of the third amplifier and the non-inverting input of the fourth amplifier, and the eighteenth input circuit being arranged between the inverting output of the third amplifier and the inverting input of the fourth amplifier, a seventh and an eighth feedback circuit, each comprising a tenth capacitor, the seventh feedback circuit being arranged between the non-inverting input and the inverting output of the fourth amplifier, and the eighth feedback circuit being arranged between the inverting input and the non-inverting output of the fourth amplifier, a ninth and a tenth feedback circuit, each comprising an eighth resistor, the ninth feedback circuit being arranged between the non-inverting input and the inverting output of the fourth amplifier, and the tenth feedback circuit being arranged between the inverting input and the non-inverting output of the fourth amplifier, and in that the inverting output of the fourth amplifier is connected to the eighth output terminal and the non-inverting output of the fourth amplifier is connected to the seventh output terminal.

This is a general fourth-order filter arrangement which enables filters having special characteristics to be obtained by varying the values of the resistors and the capacitors.

A first modification thereof is a low-pass filter and is characterized in that the capacitance values of the second capacitors in the first and the second input circuit, of the third capacitors in the third and the fourth input circuit, of the fourth capacitors in the fifth and the sixth input circuit, the sixth capacitors in the ninth and the tenth input circuit, of the seventh capacitors in the eleventh and the twelfth input circuit, and of the ninth capacitors in the fifteenth and the sixteenth input circuit are substantially zero.

A high-pass filter is obtained in an embodiment in which the conductance values of the first resistors in the first and the second input circuit are substantially zero and the capacitance values of the third capacitors in the third and the fourth input circuit and of the seventh capacitors in the eleventh and the twelfth input circuit are substantially zero.

An all-pass network is obtained in that the conductance values of the first resistors in the first and the second input circuit and of the second resistors in the first and the second coupling circuit are substantially equal, in that the conductance values of the third resistors in the seventh and the eighth input circuit and of the fourth resistors in the third and the fourth coupling circuit are substantially equal, in that the conductance values of the fifth resistors in the thirteenth and the fourteenth input circuit and of the sixth resistors in the fifth and the sixth coupling circuit are substantially equal, in that the conductance values of the seventh resistors in the seventeenth and the eighteenth input circuit and of the eighth resistors in the ninth and the tenth feedback circuit are substantially equal, in that the capacitance values of the third capacitors in the third and the fourth input circuit and of the first capacitors in the first and the second feedback circuit are substantially equal, in that the capacitance values of the fourth capacitors in the fifth and the sixth input circuit and of the fifth capacitors in the third and the fourth feedback circuit are substantially equal, in that the capacitance values of the seventh capacitors in the eleventh and the twelfth input circuit and of the eighth capacitors in the fifth and the sixth feedback circuit are substantially equal, in that the capacitance values of the ninth capacitors in the fifteenth and the sixteenth input circuit and of the tenth capacitors in the seventh and the eighth feedback circuit are substantially equal, and in that the capacitance values of the second capacitors in the first and the second input circuit and of the sixth capacitors in the ninth and the tenth input circuit are substantially zero.

BRIEF DESCRIPTION OF THE DRAWINGS

The invention will now be described in more detail, by way of example, with reference to the accompanying drawings, in which.

DESCRIPTION OF THE PREFERRED EMBODIMENTS

Hereinafter some examples of filter arrangements in accordance with the invention are described. Examples of first-order to fourth-order filter arrangements are given, in which an appropriate selection of the component values results in useful filters. However, within the scope of the invention those skilled in the art will be able to devise many other modifications of each filter type.

Figure 1:
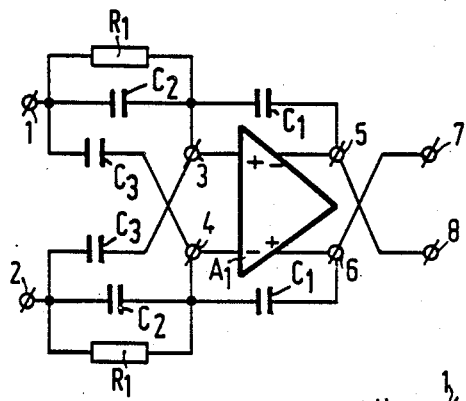
FIG. 1 shows a diagram of a first-order elementary configuration in accordance with the invention.
Figure 2:
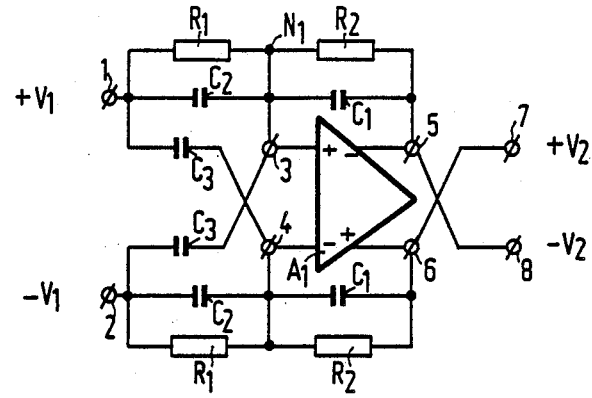
FIG. 2 shows a diagram of a general first-order filter arrangement in accordance with the invention.

FIG. 1 shows diagrammatically the elementary configuration around which all the filter arrangements are built. It comprises a balanced amplifier $A_1$ having a non-inverting input 3 and an inverting input 4, an inverting output 5 and a non-inverting output 6. The filter arrangement has two input terminals 1 and 2 and two output terminals 7 and 8. The amplifier $A_1$ comprises a feedback capacitor $C_1$ between the inverting output 5 and the non-inverting input 3 and between the non-inverting output 6 and the inverting input 4. A parallel arrangement of a resistor $R_1$ and a capacitor $C_2$ is arranged between the input terminal 1 and the non-inverting input 3 and between the input terminal 2 and the inverting input 4. A capacitor $C_3$ is arranged between the input terminal 1 and the inverting input 4 and between the input terminal 2 and the non-inverting input 3. The inverting output 5 is connected to the output 8 and the non-inverting output 6 is connected to the output 7. This crosswise connection ensures that the output signals have the same polarities as the input signals applied to the filter arrangement. The circuit is fully symmetrical and is driven by two balanced input signals of opposite polarity. FIG. 2 shows the general first-order filter arrangement. It is obtained in that in the arrangement shown in FIG. 1 two resistors $R_2$ are added between the inverting output 5 and the non-inverting input 3 and between the non-inverting output 6 and the inverting input 4. The filter arrangement operates as follows. An input voltage $+V_1$ is applied to the input terminal 1 and an equal but opposite input voltage $-V_1$ is applied to the input terminal 2. An output voltage $+V_2$ is obtained on the output terminal 7 and an equal but opposite output voltage $-V_2$ is obtained on the output terminal 8.

The voltage transfer function can be computed by solving the nodal equation for the currents at the node $N_1$. $N_1$ corresponds to the non-inverting input 3 of the amplifier $A_1$, which amplifier is assumed not to draw any input current. In that case the following equation is valid:

$$G_1 * V_1 + p*(C_2 - C_3)*V_1 = G_2*V_2 + p*C_1*V_2 \qquad (1)$$

$$\frac{V_2}{V_1} = \frac{G_1 + p*(C_2 - C_3)}{G_2 + p*C_1} \qquad (2)$$

where $G_i$ is the conductance value of the resistor $R_i$ in conformity with $1/R_i = G_i$ and where p is the complex frequency $p = j\omega$. Formula (2) is the complex transfer function of the filter arrangement expressed as a polynomial of p. The highest power of p dictates the order of the filter network. The network shown in FIG. 2 is consequently of the first-order. Varying the values of the filter components yields filter arrangements having special characteristics. Some examples of such arrangements will be given hereinafter.

Figure 3:
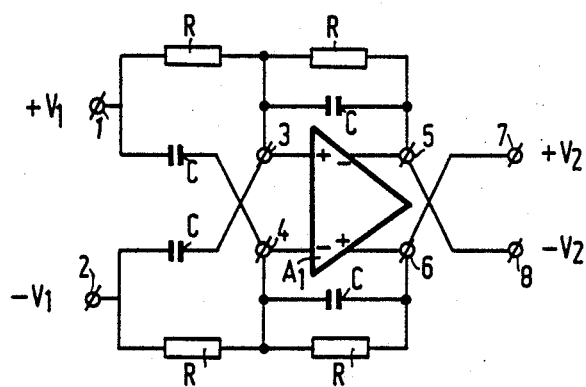
FIG. 3 shows a diagram of a first-order all-pass filter arrangement in accordance with the invention.

FIG. 3 shows a first-order all-pass filter arrangement. It is obtained by selecting $C_2 = 0$, $G_1 = G_2 = G$ and $C_3 = C_1 = C$ in the general first-order filter arrangement shown in FIG. 2. The voltage transfer function then becomes $$\frac{V_2}{V_1} = \frac{G - pC}{G + pC} \qquad (3)$$

Such a transfer function is characterized by a frequency-independent amplitude response.

Figure 4:
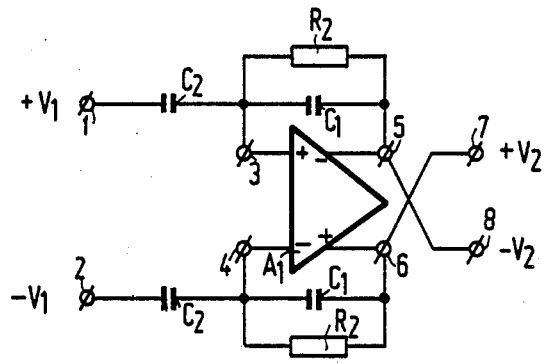
FIG. 4 shows a diagram of a first-order high-pass filter arrangement in accordance with the invention.

FIG. 4 shows a second example. It is a first-order high-pass filter arrangement obtained by making $G_1 = 0$ and $C_3 = 0$ in the general first-order filter arrangement shown in FIG. 2. The transfer function is then $$\frac{V_2}{V_1} = \frac{p*C_2}{G_2 + pC_1} \qquad (4)$$

Further it is to be noted that a first-order low-pass filter arrangement can be obtained by making $C_2 = 0$ and $C_3 = 0$ in the general filter arrangement shown in FIG. 2.

Figure 5:
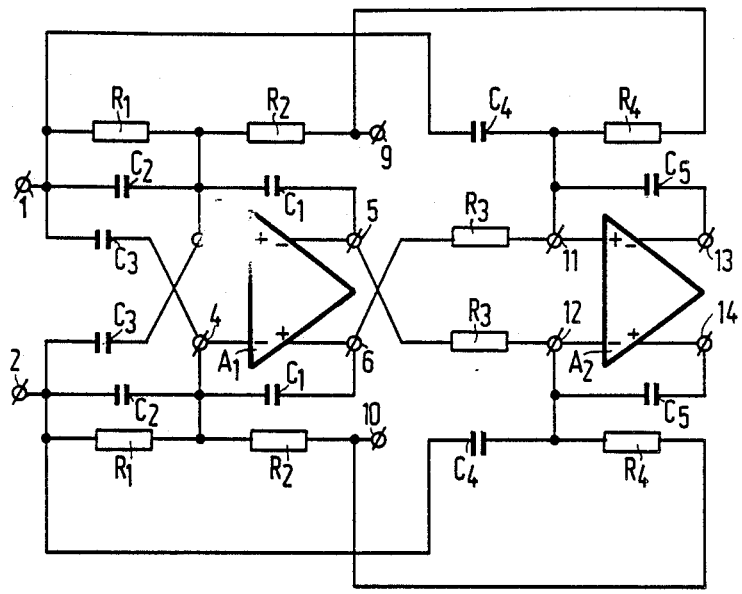
FIG. 5 shows a diagram of a second-order elementary configuration in accordance with the invention.
Figure 6:
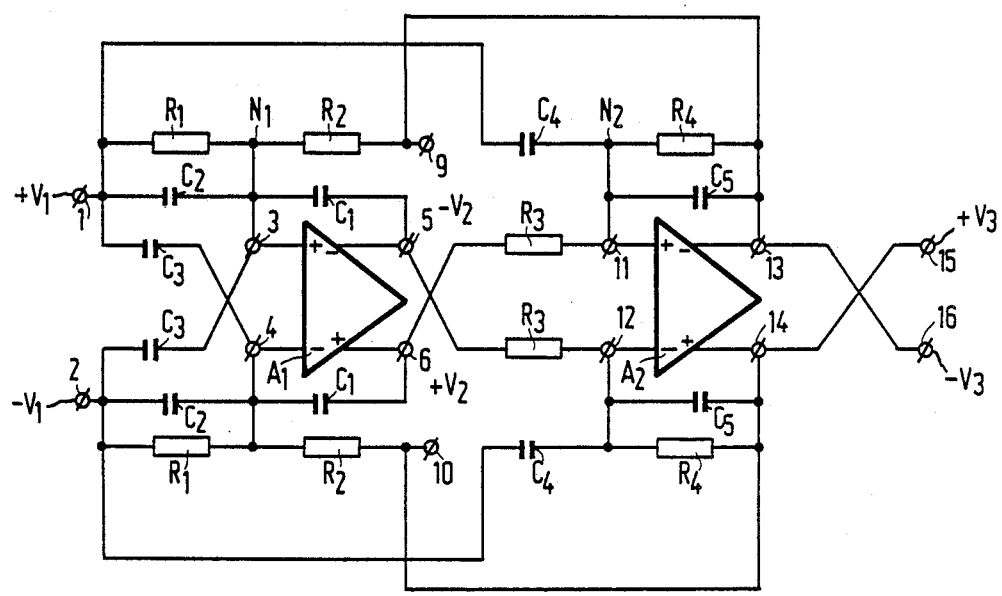
FIG. 6 shows a diagram of a general second-order filter arrangement in accordance with the invention.

Extending the elementary configuration shown in FIG. 1 yields a filter arrangement which may be regarded as the elementary configuration for second-order filter arrangements shown diagrammatically in FIG. 5. It is obtained by adding the following components to the arrangement shown in FIG. 1: a second balanced amplifier $A_2$ having a non-inverting input 11, an inverting input 12, an inverting output 13 and a non-inverting output 14; a resistor $R_2$ between the node 9 and the non-inverting input 3 of the first amplifier $A_1$ and between the node 10 and the inverting input 4 of the amplifier $A_1$; a resistor $R_4$ between the non-inverting input 11 of the amplifier $A_2$ and the node 9, and between the inverting input 12 of the amplifier $A_2$ and the node 10; a resistor $R_3$ between the non-inverting output 6 of the amplifier $A_1$ and the non-inverting input 11 of the amplifier $A_2$ and between the inverting output 5 of $A_1$ and the inverting input 12 of the amplifier $A_2$; a capacitor $C_4$ between the input terminal 1 and the non-inverting input 11 of the amplifier $A_2$ and between the input terminal 2 and the inverting input 12 of the amplifier $A_2$; a capacitor $C_5$ between the non-inverting input 11 and the inverting output 13 of the amplifier $A_2$ and between the inverting input 12 and the non-inverting output 14 of the amplifier $A_2$. A general second-order filter arrangement is shown in FIG. 6 and is obtained by providing in the arrangement shown in FIG. 5 a connection between the node 9 and the inverting output 13 of the amplifier $A_2$ and between the node 10 and the non-inverting output 14 of the amplifier $A_2$. In addition, the inverting output 13 of the amplifier $A_2$ is connected to the output terminal 16 and the non-inverting output 14 of the amplifier $A_2$ is connected to the output terminal 15. This cross connection at the output of the arrangement ensures that the output signals have the same polarities as the input signals.

An input voltage $+V_1$ is applied to the input terminal 1 and an input voltage $-V_1$ is applied to the input terminal 2. A voltage $-V_2$ is obtained on the inverting output 5 of the amplifier $A_1$ and a voltage $+V_2$ is obtained on the non-inverting output 6 of the amplifier $A_1$. A voltage $+V_3$ is obtained on the output terminal 15 of the filter arrangement and a voltage $-V_3$ appears on the output terminal 16. The plus and minus signs preceding the signal voltages indicate that the signal voltages are of equal amplitude but opposite polarity. In order to calculate the voltage transfer function it is assumed that the balanced amplifiers $A_1$ and $A_2$ draw no input current. Moreover, a second node $N_2$ is introduced, which corresponds to the non-inverting input 11 of the amplifier $A_2$. The node $N_1$ complies with:

$$G_1*V_1 + p*(C_2-C_3)*V_1 = G_2*V_3 + p*C_1*V_2 \quad (5)$$

and the node $N_2$ complies with:

$$G_3*V_2 + p*C_4*V_1 = G_4*V_3 + p*C_5*V_3 \quad (6)$$

$V_2$ can be eliminated from the set of equations by multiplying the terms of equation (5) by $G_3$ and those of equation (6) by $p*C_1$ and subsequently adding (5) and (6) to one another, which operations may be represented by the following diagrammatic notation $$\begin{array}{c} (5) *G_3 \\ (6) *p*C_1 \\ \hline + \end{array} \quad (7)$$

From the result the voltage transfer function can be computed:

$$\frac{V_3}{V_1} = \frac{G_1*G_3 + p*(C_2-C_3)*G_3 + p*p*C_1*C_4}{G_2*G_3 + p*C_1*G_4 + p*p*C_1*C_5} \quad (8)$$

This is a second-order transfer function. By an appropriate choice of the values of the filter components special second-order filter arrangements are obtained, of which a number of examples will be described hereinafter. A second-order low-pass filter arrangement is obtained by selecting $C_2=C_3=C_4=O$ in (8). The voltage transfer function then becomes:

$$\frac{V_3}{V_1} = \frac{G_1*G_3}{G_2*G_3 + p*C_1*G_4 + p*p*C_1*C_5} \quad (9)$$

Figure 7:
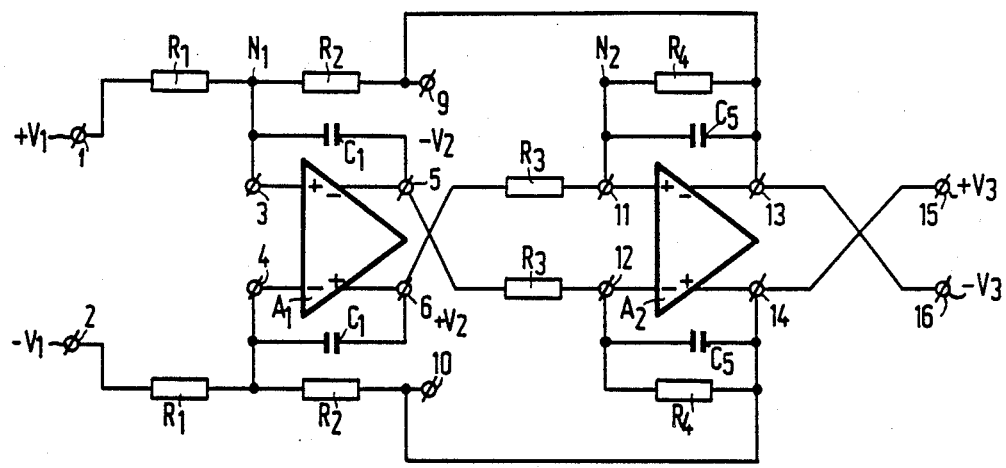
FIG. 7 shows a diagram of a second-order low-pass filter arrangement in accordance with the invention.

The diagram of the low-pass filter is shown in FIG. 7.

Figure 8:
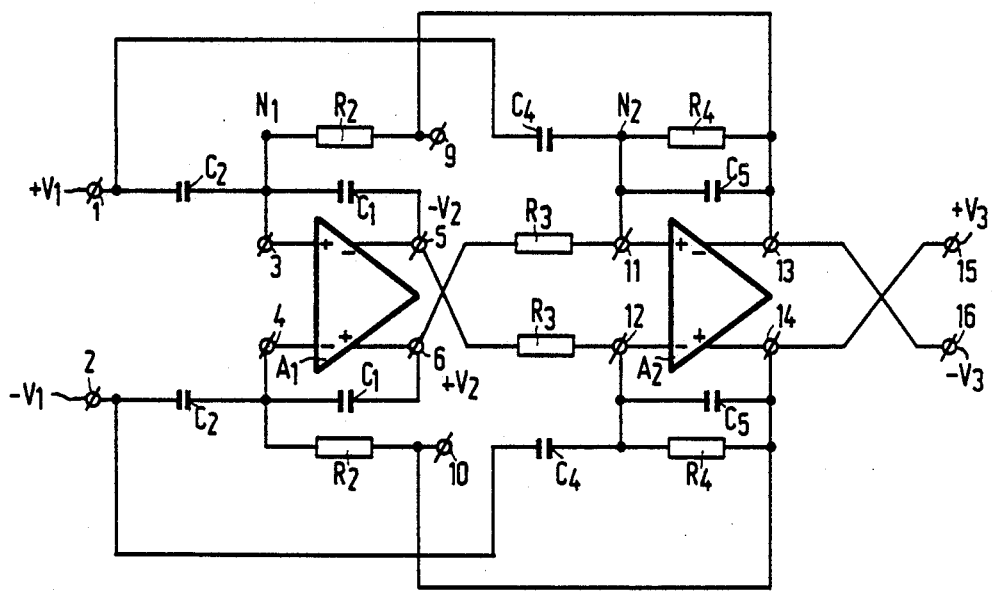
FIG. 8 shows a diagram of a second-order high-pass filter arrangement in accordance with the invention.

A second-order high-pass filter arrangement is obtained by selecting $G_1=O$ and $C_3=O$ in (8). The voltage transfer function then becomes:

$$\frac{V_3}{V_1} = \frac{p*C_2*G_3 + p*p*C_1*C_4}{G_2*G_3 + p*C_1*G_4 + p*p*C_1*C_5} \quad (10)$$

and the diagram of the high-pass filter is shown in FIG. 8.

Figure 9:
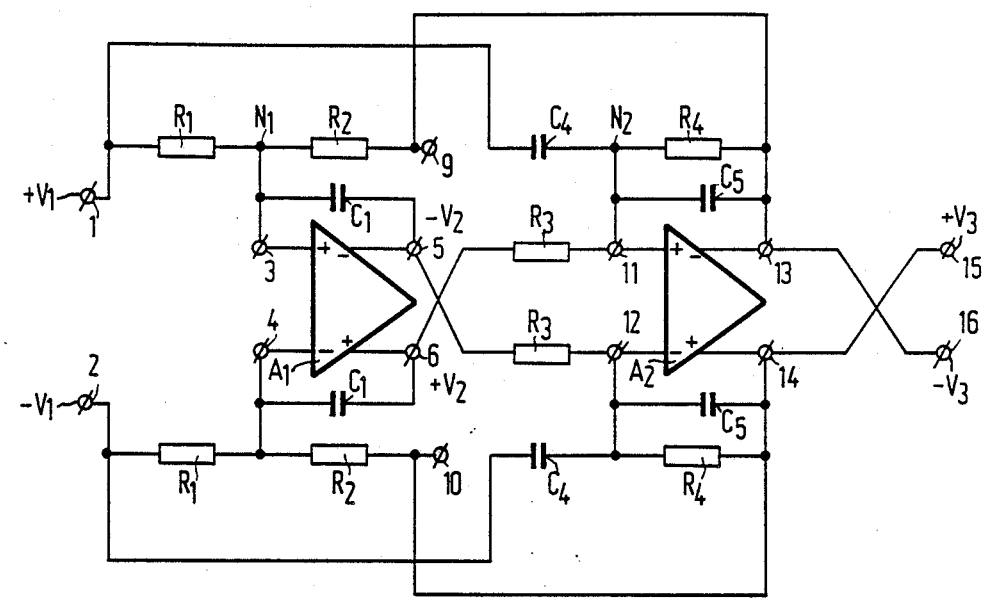
FIG. 9 shows a diagram of a second-order filter arrangement in accordance with the invention having a transmission zero point.

A second-order filter arrangement with which the frequency can be rejected, also referred to as a band-rejection filter or notch filter, is obtained by selecting $C_2=C_3=O$ in (8). The voltage transfer function is then:

$$\frac{V_3}{V_1} = \frac{G_1*G_3 + p*p*C_1*C_4}{G_2*G_3 + p*C_1*G_4 + p*p*C_1*C_5} \quad (11)$$

and the diagram is given in FIG. 9. A further example relates to a filter arrangement which behaves as a second-order all-pass filter. By selecting $G_2=G_1$, $G_4=G_3$, $C_2=O$, $C_1=C_3$ and $C_5=C_4$ in (8), the voltage transfer function becomes:

$$\frac{V_3}{V_1} = \frac{G_1*G_3 - p*C_3*G_3 + p*p*C_3*C_4}{G_2*G_3 + p*C_3*G_3 + p*p*C_3*C_4} \quad (12)$$

Figure 10:
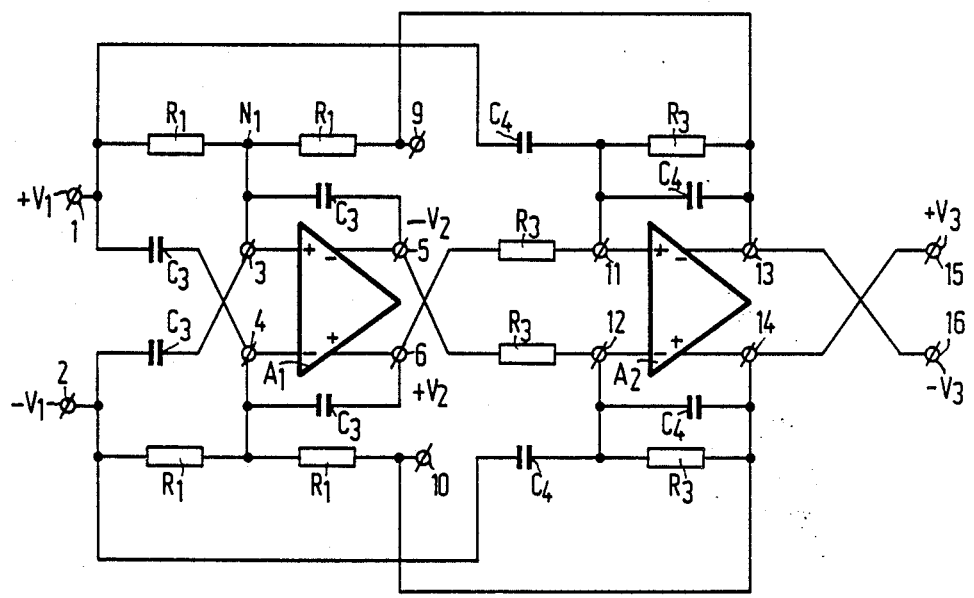
FIG. 10 shows a diagram of a second-order all-pass filter arrangement in accordance with the invention.

The diagram of the all-pass filter is shown in FIG. 10.

Figure 11:
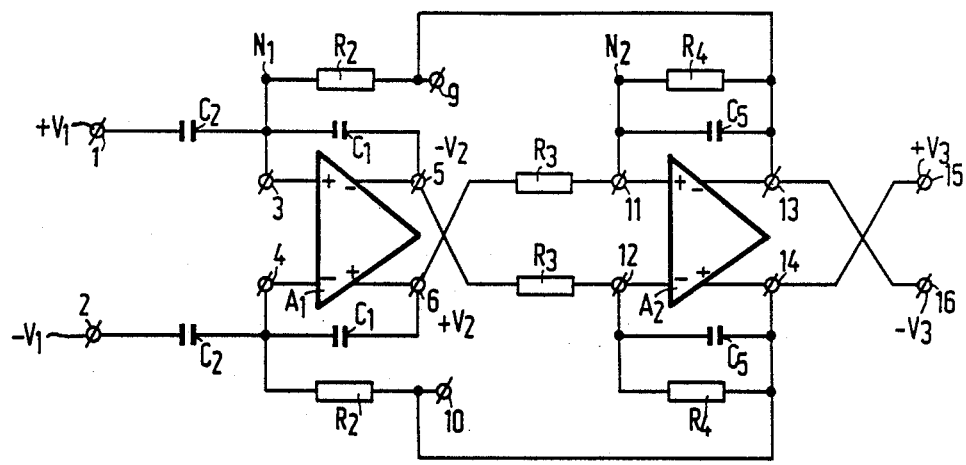
FIG. 11 shows a diagram of a second-order band-pass filter arrangement in accordance with the invention.

The last example of a special second-order filter arrangement is a second-order band-pass arrangement shown in FIG. 11. It is obtained by selecting by $G_1=O$ and $C_3=C_4=O$ in (8). The voltage transfer function then becomes:

$$\frac{V_3}{V_1} = \frac{p*C_2*G_3}{G_2*G_3 + p*C_1*G_4 + p*p*C_1*C_5} \quad (13)$$

Figure 12:
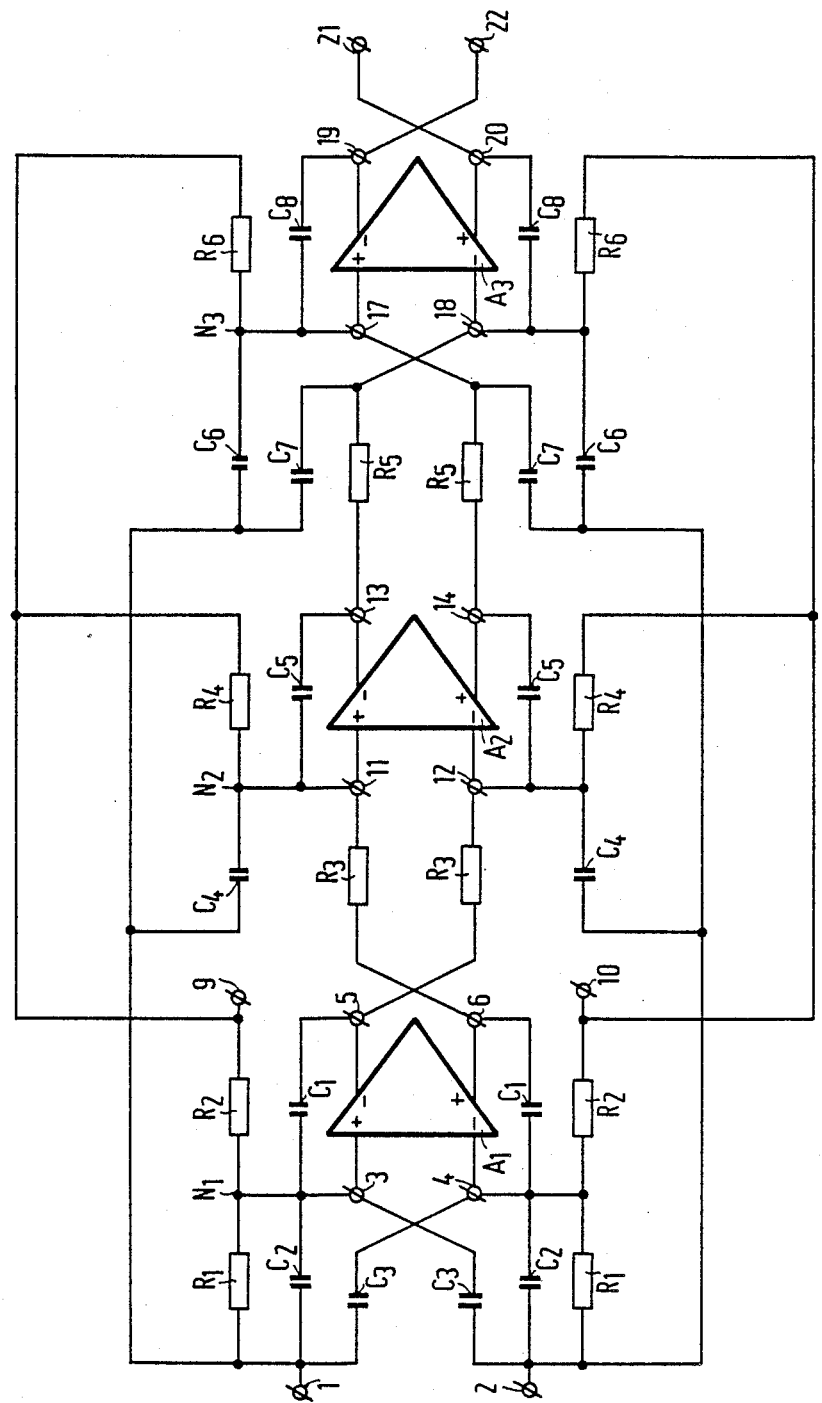
FIG. 12 shows a diagram of a third-order elementary configuration in accordance with the invention.
Figure 13:
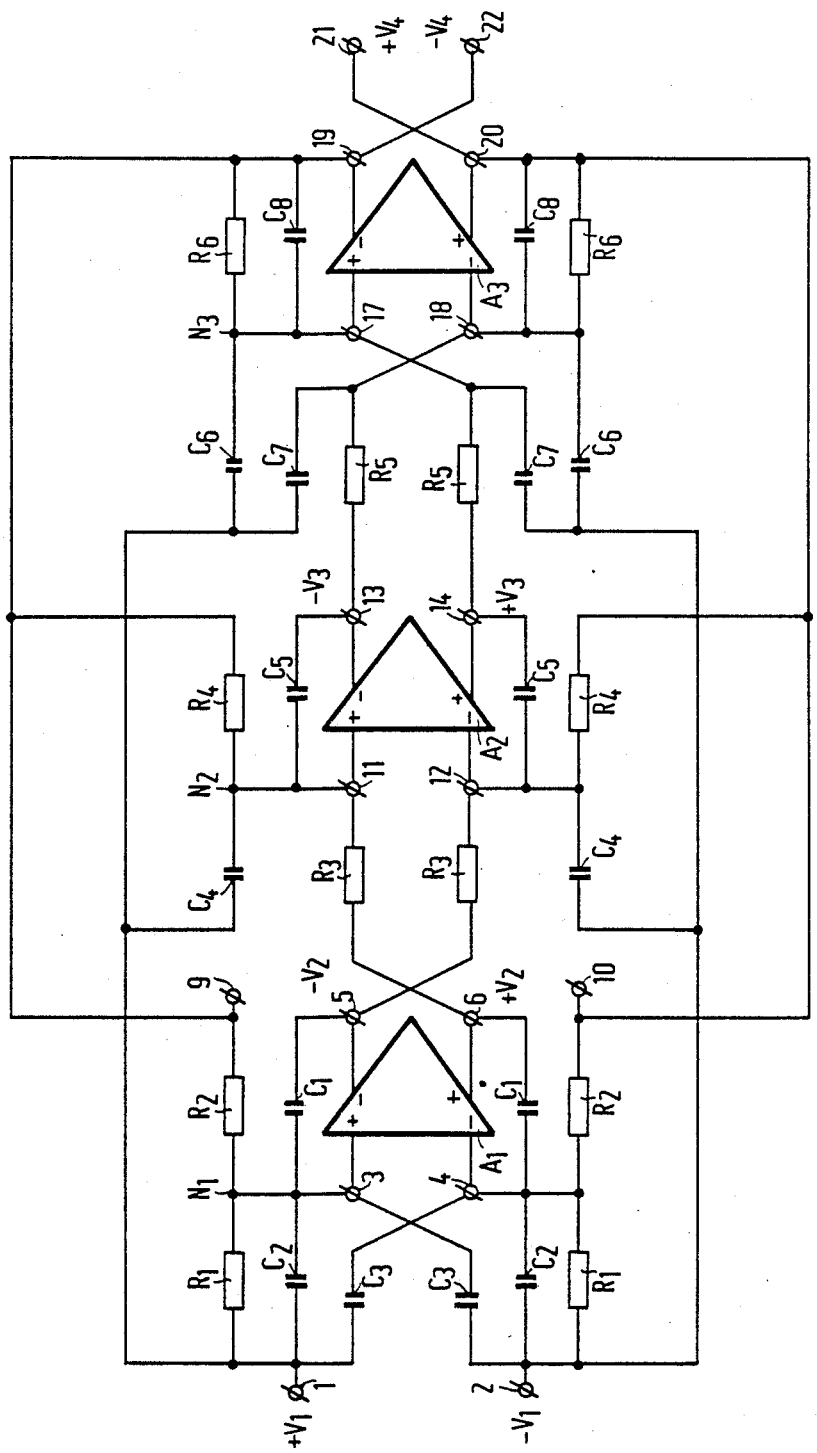
FIG. 13 shows a diagram of a general third-order filter arrangement in accordance with the invention.

The elementary configuration for the second-order filter arrangement of FIG. 5 can be extended to obtain a third-order elementary configuration whose diagram is shown in FIG. 12. It is obtained by adding the following components to the arrangement of FIG. 5: a balanced amplifier $A_3$ having a non-inverting input 17 and an inverting input 18 and having an inverting output 19 and a non-inverting output 20; a capacitor $C_6$ between the input terminal 1 and the non-inverting input 17 and between the input terminal 2 and the inverting input 18; a capacitor $C_7$ between the input terminal 1 and the inverting input 18 and between the input terminal 2 and the non-inverting input 17; a resistor $R_5$ between the inverting output 13 and the inverting input 18 and between the non-inverting output 14 and the non-inverting input 17; a capacitor $C_8$ between the non-inverting input 17 and the inverting output 19 and between the inverting input 18 and the non-inverting output 20; a resistor $R_6$ between the node 9 and the non-inverting input 17 and between the node 10 and the inverting input 18. Further, the inverting output 19 is connected to the output terminal 22 and the non-inverting output 20 is connected to the output terminal 21. A general third-order filter arrangement is shown in FIG. 13 and is formed by arranging a connection between the node 9 and the inverting output 19 and between the node 10 and the non-inverting output 20 in the arrangement shown in FIG. 12. An input voltage $+V_1$ is applied to the input terminal 2 and an input voltage $-V_1$ is applied to the input terminal 2. The output voltage on the inverting output 5 of the amplifier $A_1$ is $-V_2$, that on the non-inverting output 6 of the amplifier $A_1$ is $+V_2$, that on the inverting output 13 of the amplifier $A_2$ is $-V_3$, that on the non-inverting output 14 of the amplifier $A_2$ is $+V_3$, that on the output terminal 21 is $+V_4$, and that on the output terminal 22 is $-V_4$. Moreover, a third node $N_3$ is shown, which node corresponds to the non-inverting input 17 of the amplifier $A_3$.

The node $N_1$ complies with:

$$G_1 {}^*V_1 + p^*(C_2 - C_3)^*V_1 = G_2 {}^*V_4 + p^*C_1 {}^*V_2 \tag{14}$$

The node $N_2$ complies with:

$$G_3 {}^*V_2 + p^*C_4 {}^*V_1 = G_4 {}^*V_4 + p^*C_5 {}^*V_3 \tag{15}$$

and the node $N_3$ complies with:

$$G_5 {}^*V_3 + p^*(C_6 - C_7)^*V_1 = G_6 {}^*V_4 + p^*C_8 {}^*V_4 \tag{16}$$

In these three equations $V_2$ and $V_3$ can be eliminated as follows:

$$\begin{array}{l}(14)\; {}^*G_3 {}^*G_5\\(15)\; {}^*p^*C_1 {}^*G_5\\ \underline{(16)\; {}^*p^*C_1 {}^*p^*C_4} \\ \quad\quad\quad + \end{array} \tag{17}$$

which yields the following voltage transfer function:

$$\frac{V_4}{V_1} = \frac{\begin{array}{c}G_1 {}^*G_3 {}^*G_5 + p^*(C_2 - C_3)^*G_3 {}^*G_5 + \\ p^*p^*C_1 {}^*C_4 {}^*G_5 + p^*p^*p^*C_1 {}^*C_5 {}^*(C_6 - C_7)\end{array}}{\begin{array}{c}G_2 {}^*G_3 {}^*G_5 + p^*C_1 {}^*G_4 {}^*G_5 + \\ p^*p^*C_1 {}^*C_5 {}^*G_6 + p^*p^*p^*C_1 {}^*C_5 {}^*C_8\end{array}} \tag{18}$$

Filters having special characteristics can be obtained by an appropriate choice of the values of the filter elements in the general third-order filter arrangement of FIG. 13.

Figure 14:
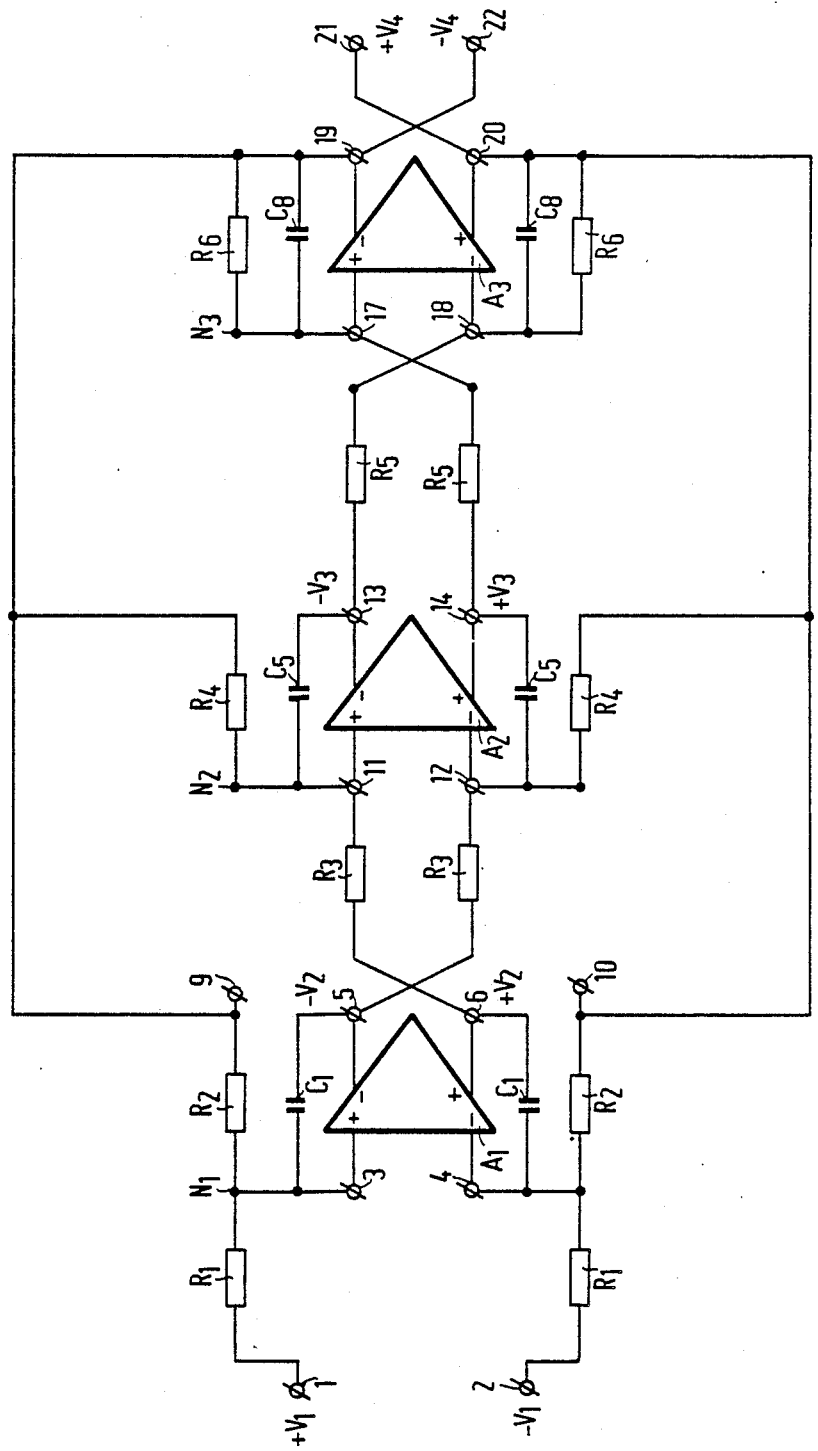
FIG. 14 shows a diagram of a third-order low-pass filter arrangement in accordance with the invention.

A first example is a third-order low-pass filter, of which the diagram is shown in FIG. 14. This is achieved by selecting $C_2 = C_3 = C_4 = C_6 = C_7 = O$ in (18). The transfer function then becomes:

$$\frac{V_4}{V_1} = \frac{G_1 {}^*G_3 {}^*G_5}{\begin{array}{c}G_2 {}^*G_3 {}^*G_5 + p^*C_1 {}^*G_4 {}^*G_5 + \\ p^*p^*C_1 {}^*C_5 {}^*G_6 + p^*p^*p^*C_1 {}^*C_5 {}^*C_8\end{array}} \tag{19}$$

Figure 15:
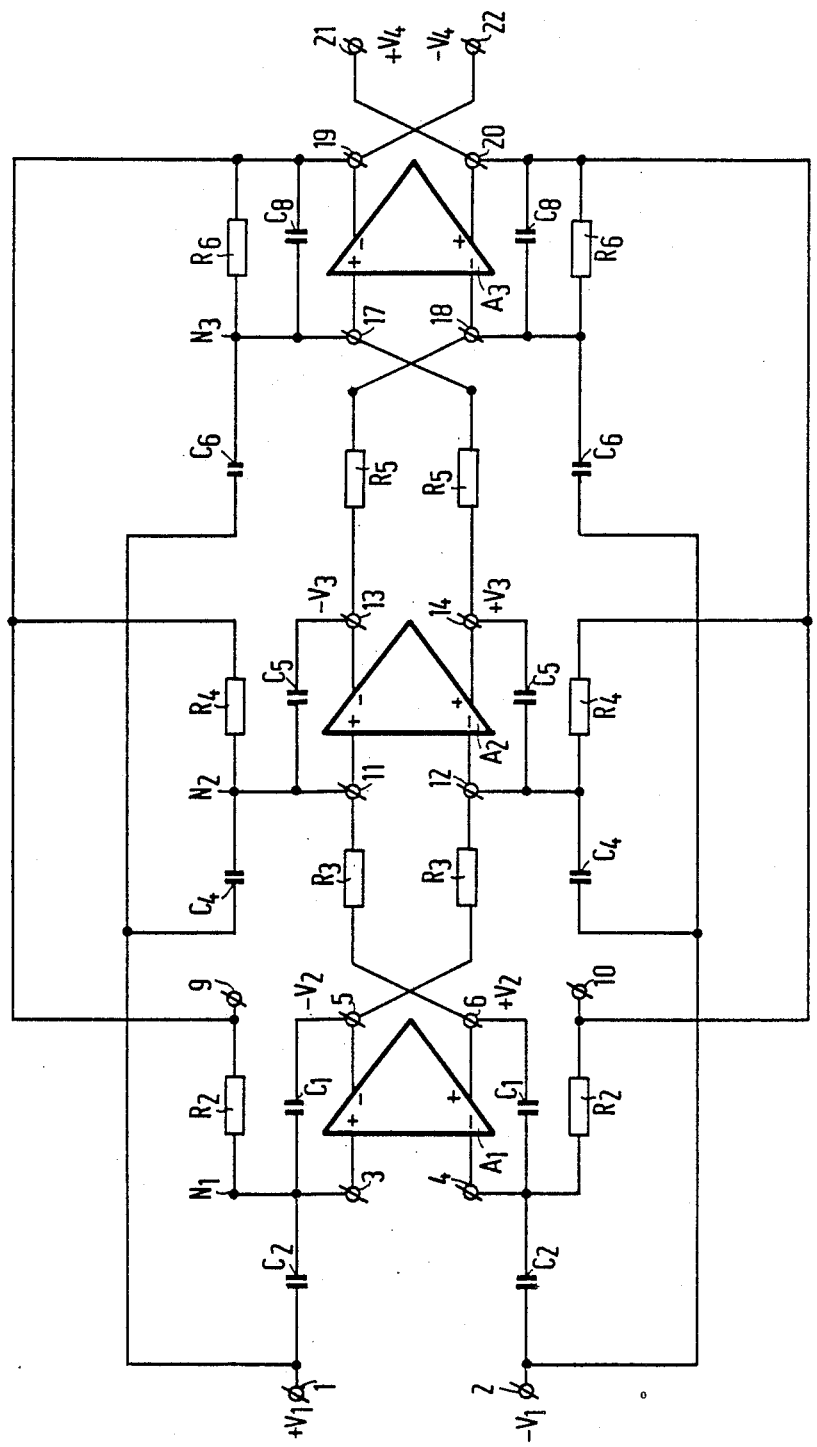
FIG. 15 shows a diagram of a third-order high-pass filter arrangement in accordance with the invention.

A second example is a third-order high-pass filter arrangement, shown in FIG. 15, which is obtained by selecting $G_1 = O$ and $C_3 = C_7 = O$ in (18). The transfer function is then:

$$\frac{V_4}{V_1} = \frac{\begin{array}{c}p^*C_2 {}^*G_3 {}^*G_5 + p^*p^*C_1 {}^*C_4 {}^*G_5 + \\ p^*p^*p^*C_1 {}^*C_5 {}^*C_6\end{array}}{\begin{array}{c}G_2 {}^*G_3 {}^*G_5 + p^*C_1 {}^*G_4 {}^*G_5 + \\ p^*p^*C_1 {}^*C_5 {}^*G_6 + p^*p^*p^*C_1 {}^*C_5 {}^*C_8\end{array}} \tag{20}$$

Figure 16:
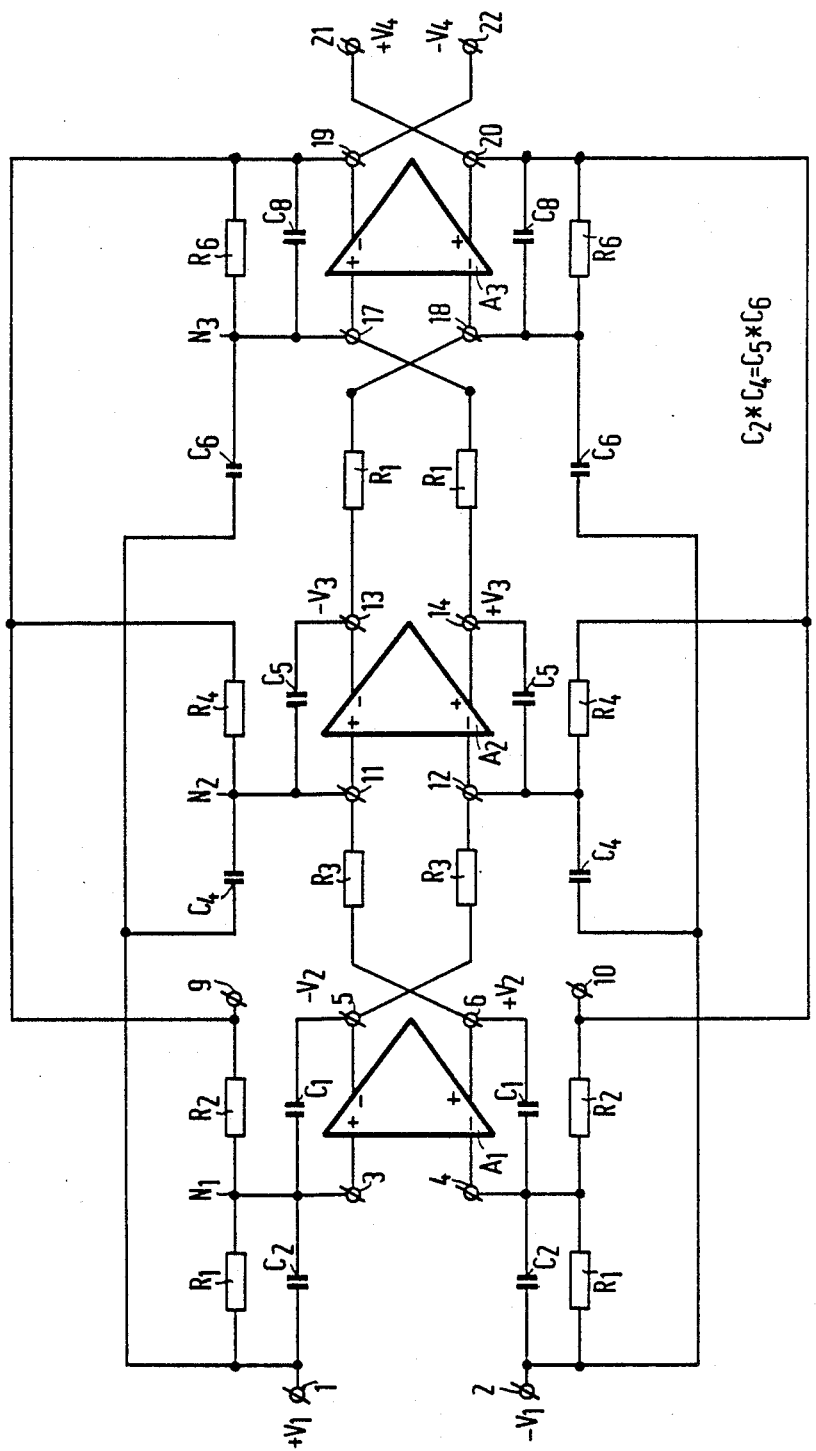
FIG. 16 shows a diagram of a third-order filter arrangement in accordance with the invention having a transmission zero point.

A third example is a third-order band-rejection filter, whose diagram is shown in FIG. 16. By selecting $G_5 = G_1$, $C_3 = C_7 = O$ and $C_2 {}^*C_4 = C_5 {}^*C_6$ in (18) the voltage transfer function becomes:

$$\frac{(G_1 {}^*G_3 + p^*p^*C_1 {}^*C_4)^*(G_1 + p^*C_2/G_1)}{\begin{array}{c}G_2 {}^*G_3 {}^*G_1 + p^*C_1 {}^*G_4 {}^*G_1 + \\ p^*p^*C_1 {}^*C_5 {}^*G_6 + p^*p^*p^*C_1 {}^*C_5 {}^*C_8\end{array}} \tag{21}$$

The numerator of (21) now includes a term equal to the numerator of the voltage transfer function (11) of a second-order band-rejection filter.

Figure 17:
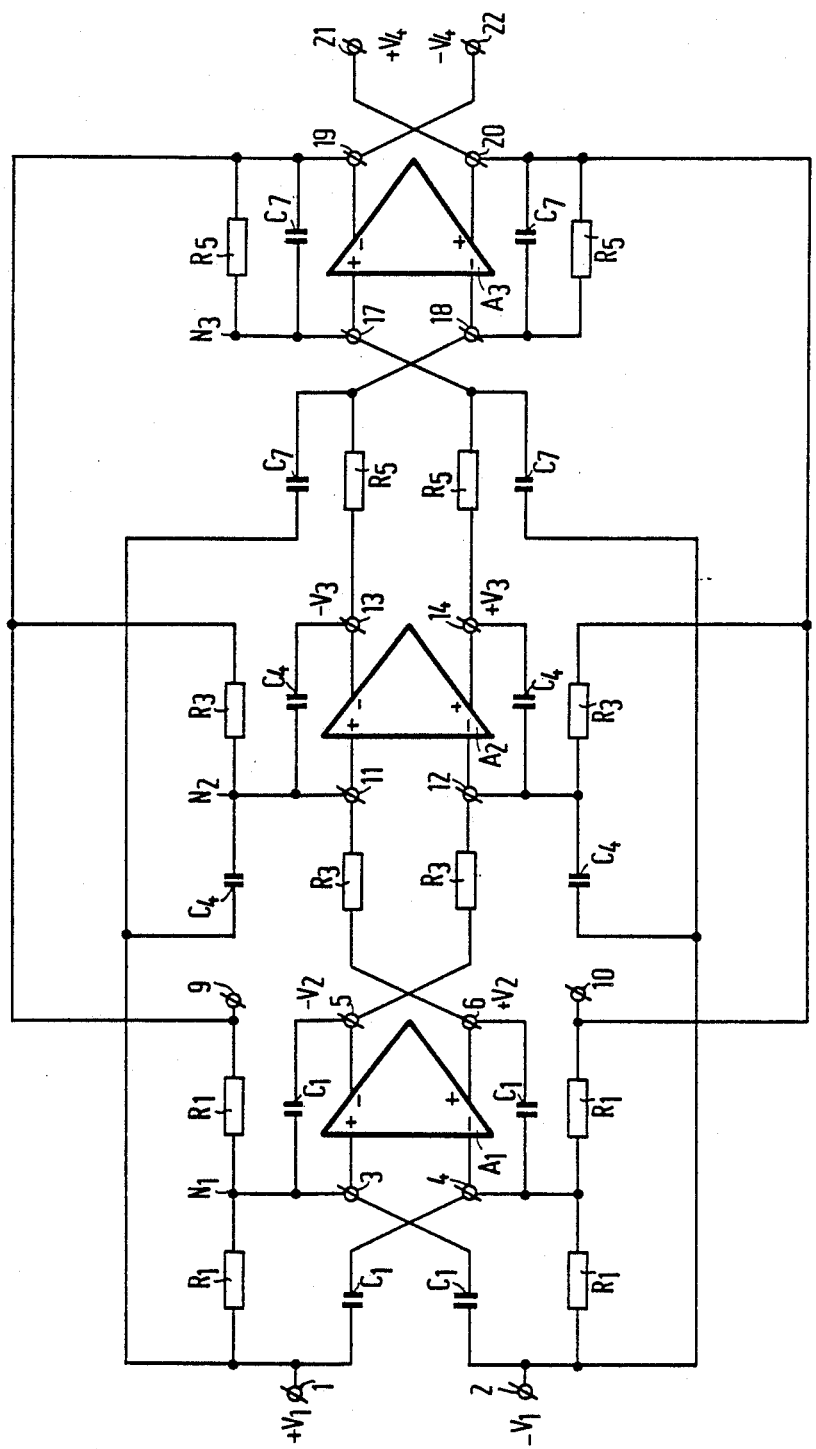
FIG. 17 shows a diagram of a third-order all-pass filter arrangement in accordance with the invention.

FIG. 17 shows a fourth example. It is a third-order all-pass filter arrangement obtained by selecting $G_2 = G_1$, $G_4 = G_3$, $G_6 = G_5$, $C_2 = C_6 = O$, $C_3 = C_1$, $C_5 = C_4$ and $C_8 = C_7$ in formula (18). The voltage transfer function is then:

$$\frac{V_4}{V_1} = \frac{\begin{array}{c}G_1 {}^*G_3 {}^*G_5 - p^*C_1 {}^*G_3 {}^*G_5 + \\ p^*p^*C_1 {}^*C_4 {}^*G_5 - p^*p^*p^*C_1 {}^*C_4 {}^*C_7\end{array}}{\begin{array}{c}G_1 {}^*G_3 {}^*G_5 + p^*C_1 {}^*G_3 {}^*G_5 + \\ p^*p^*C_1 {}^*C_4 {}^*G_5 + p^*p^*p^*C_1 {}^*C_4 {}^*C_7\end{array}} \tag{22}$$

Figure 18:
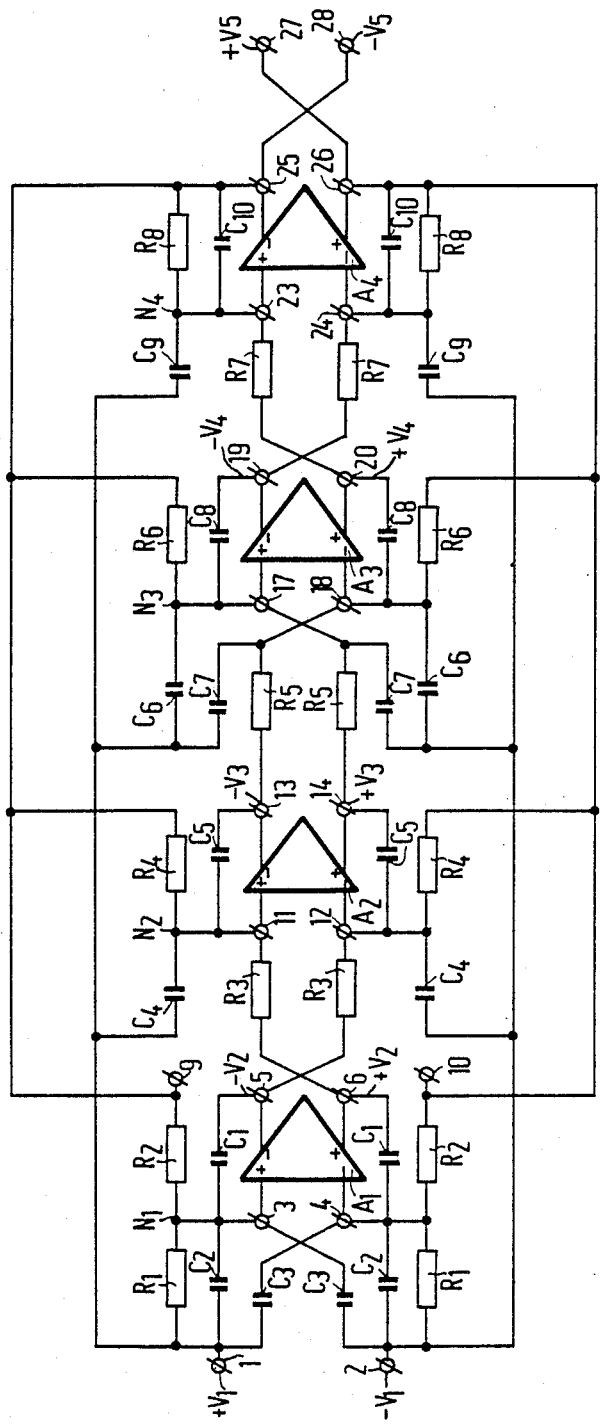
FIG. 18 shows a diagram of a general fourth-order filter arrangement in accordance with the invention.

The third-order elementary configuration of FIG. 12 can be extended to obtain a general fourth-order arrangement, whose diagram is shown in FIG. 18, by adding the following components to the arrangement shown in FIG. 12: a balanced amplifier $A_4$ having a non-inverting input 23 and an inverting input 24 and having an inverting output 25 and a non-inverting output 26; a capacitor $C_9$ between the first input terminal 1 and the non-inverting input 23 and between the input terminal 2 and the inverting input 24, a resistor $R_7$ between the inverting output 19 and the inverting input 24 and between the non-inverting output 20 and the non-inverting input 23; the parallel arrangement of a resistor $R_8$ and a capacitor $C_{10}$ between the non-inverting input 23 and the inverting output 25 and between the inverting input 24 and the non-inverting output 26. Moreover, a connection is arranged between a first output terminal 27 and the non-inverting output 26 and between the second output terminal 28 and the inverting output 25.

It is to be noted that the arrangement shown in FIG. 18 is not identical to a fourth-order elementary configuration corresponding to the third-order elementary configuration of FIG. 12, the second-order elementary configuration of FIG. 5 and the first-order elementary configuration of FIG. 1, but is a general fourth-order filter arrangement corresponding to the general third-order filter arrangement shown in FIG. 13, the general second-order filter arrangement of FIG. 16, and the general first-order filter arrangement of FIG. 2. Extension to fifth-order and higher-order elementary configurations and fifth-order and higher-order general filter arrangement derived therefrom is readily possible by proceeding with the extensions in a manner as specified in the foregoing.

An input voltage $+V_1$ is applied to the input terminal 1 and an input voltage $-V_1$ is applied to an input terminal 2. The output voltage on the inverting output 5 of the amplifier $A_1$ is $-V_2$, that on the non-inverting output 6 of the amplifier $A_1$ is $+V_2$, that on the inverting output 13 of the amplifier $A_2$ is $-V_3$, that on the non-inverting output 14 of the amplifier $A_2$ is $+V_3$, that on the inverting output 19 of the amplifier $A_3$ is $-V_4$, that on the non-inverting output 20 of the amplifier $A_3$ is $+V_4$, that on the output terminal 27 is $+V_5$, and that on the output terminal 28 is $-V_5$. Moreover, a fourth node $N_4$ is shown, which node corresponds to the non-inverting input 23 of the amplifier $A_4$. The voltage transfer function is computed by calculating the currents in the four nodes $N_1 \ldots N_4$. It is assumed that the amplifiers $A_1 \ldots A_4$ draw no input current. The node $N_1$ complies with:

$$G_1*V_1 + p*(C_2-C_3)*V_1 = G_2*V_5 + p*C_1*V_2 \quad (23)$$

$N_2$ complies with:

$$G_3*V_2 + p*C_4*V_1 = G_4*V_5 + p*C_5*V_3 \quad (24)$$

$N_3$ complies with:

$$G_5*V_3 + p*(C_6-C_7)*V_1 = G_6*V_5 + p*C_8*V_4 \quad (25)$$

and $N_4$ complies with:

$$G_7*V_4 + p*C_9*V_1 = G_8*V_5 + p*C_{10}*V_5 \quad (26)$$

In this set of equations $V_2$, $V_3$ and $V_4$ can be eliminated by:

$$\begin{array}{l}(23) *G_3*G_5*G_7 \\ (24) *p*C_1*G_5*G_7 \\ (25) *p*C_1*p*C_5*G_7 \\ (26) *p*C_1*p*C_5*p*C_8 \end{array} + \quad (27)$$

This yields the following voltage transfer function:

$$\frac{V_5}{V_1} = \frac{\begin{array}{c}G_1*G_3*G_5*G_7 + p*(C_2-C_3)*G_3*G_5*G_7 + \\ p*p*C_1*C_4*G_5*G_7 + \\ p*p*p*C_1*\text{m }C_5*(C_6-C_7)*G_7 + \\ p*p*p*p*C_1*C_5*C_8*C_9\end{array}}{\begin{array}{c}G_2*G_3*G_5*G_7 + p*C_1*G_4*G_5*G_7 + \\ p*p*C_1*C_5*G_6*G_7 + p*p*p*C_1*C_5*C_8*G_8 + \\ p*p*p*p*C_1*C_5*C_8*C_{10}\end{array}} \quad (28)$$

By selecting suitable values for the filter components in (28) special arrangements can be derived from the general fourth-order filter arrangement of FIG. 18, of which a number of examples will be given hereinafter.

A fourth-order low-pass filter arrangement is obtained by selecting $C_2=C_3=C_4=C_6=C_7=C_9=O$ in (28). The voltage transfer function is then:

$$\frac{V_5}{V_1} = \frac{G_1*G_3*G_5*G_7}{\begin{array}{c}G_2*G_3*G_5*G_7 + p*C_1*G_4*G_5*G_7 + \\ p*p*C_1*C_5*G_6*G_7 + \\ p*p*p*C_1*C_5*C_8*G_8 + p*p*p*p*C_1*C_5*C_8*C_{10}\end{array}} \quad (29)$$

Figure 19:
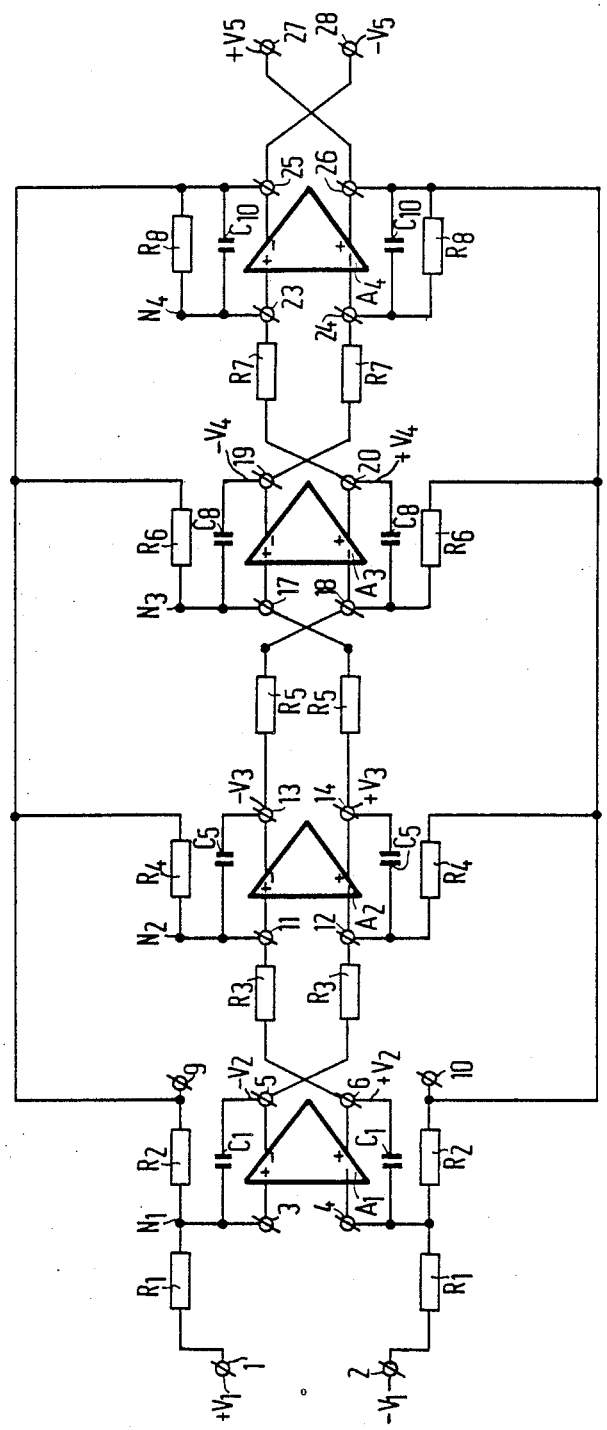
FIG. 19 shows a diagram of a fourth-order low-pass filter arrangement in accordance with the invention.

The diagram is shown in FIG. 19

Figure 20:
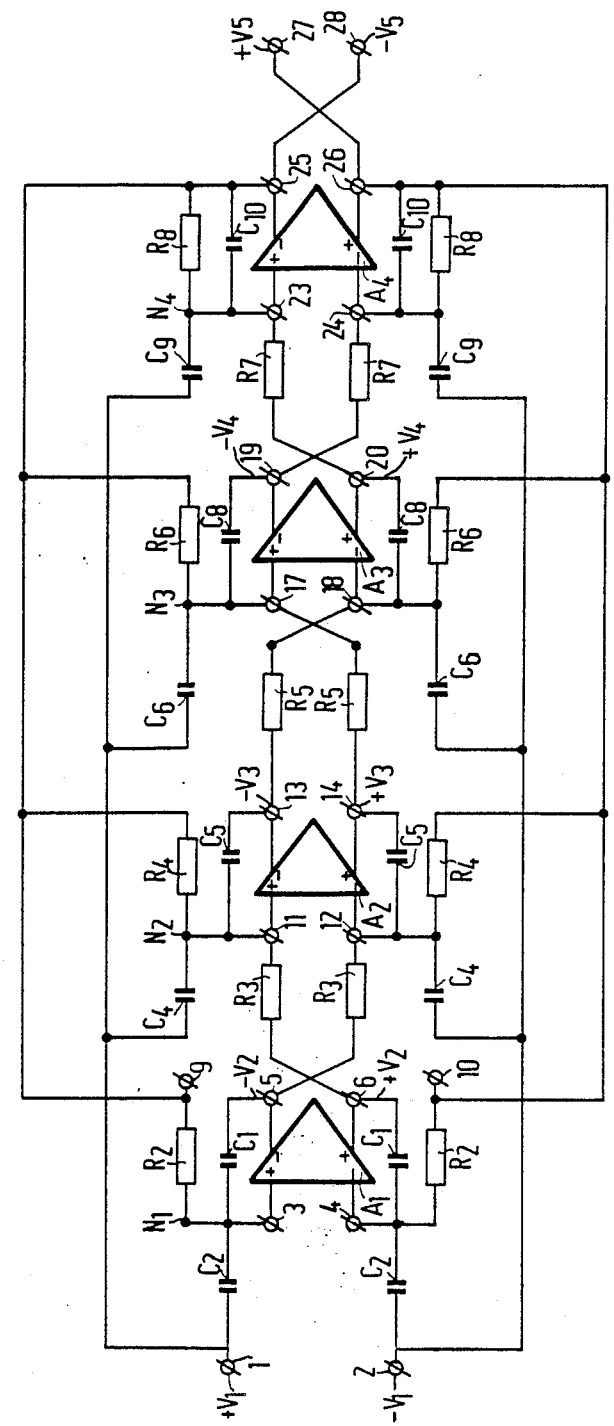
FIG. 20 shows a diagram of a fourth-order high-pass filter arrangement in accordance with the invention.

FIG. 20 shows a fourth-order high-pass filter arrangement obtained by selecting $G_1=O$ and $C_3=C_7=O$ in (28). The voltage transfer function is then:

$$\frac{V_5}{V_1} = \frac{\begin{array}{c}p*C_2*G_3*G_5*G_7 + p*p*C_1*C_4*G_5*G_7 + \\ p*p*p*C_1*C_5*C_6*G_7 + p*p*p*p*C_1*C_5*C_8*C_9\end{array}}{\begin{array}{c}G_2*G_3*G_5*G_7 + p*C_1*G_4*G_5*G_7 + \\ p*p*C_1*C_5*G_6*G_7 + p*p*p*C_1*C_5*C_8*G_8 + \\ p*p*p*p*C_1*C_5*C_8*C_{10}\end{array}} \quad (30)$$

Figure 21:
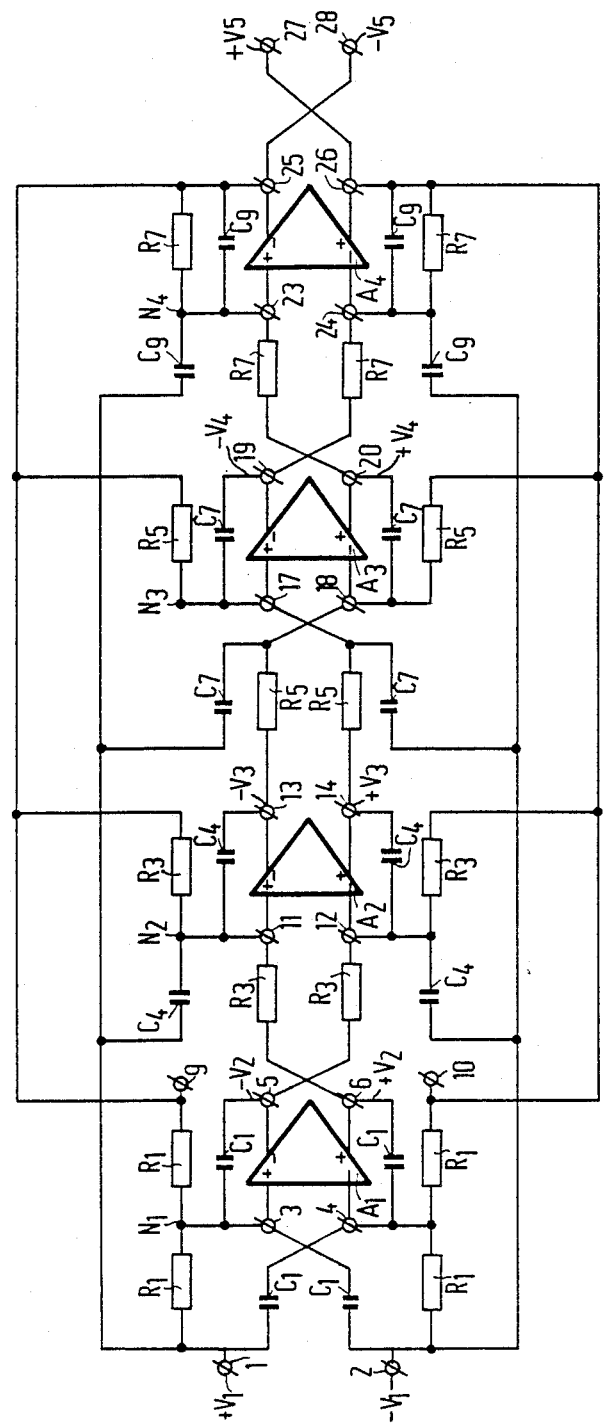
FIG. 21 shows a diagram of a fourth-order all-pass filter arrangement in accordance with the invention.

FIG. 21 shows a fourth-order all-pass filter arrangement. It is obtained by the following selection of components in formula (28): $G_2=G_1$, $G_4=G_3$, $G_6=G_5$ and $G_8=G_7$; $C_2=C_6=O$; $C_3=C_1$, $C_5=C_4$, $C_8=C_7$ and $C_{10}=C_9$. The voltage transfer function may then be written as follows:

$$\frac{V_5}{V_1} = \frac{\begin{array}{c}G_1*G_3*G_5*G_7 - p*C_1*G_3*G_5*G_7 + \\ p*p*C_1*C_4*G_5*G_7 - \\ p*p*p*C_1*C_4*C_7*G_7 + p*p*p*p*C_1*C_4*C_7*C_9\end{array}}{\begin{array}{c}G_1*G_3*G_5*G_7 + p*C_1*G_3*G_5*G_7 + \\ p*p*C_1*C_4*G_5*G_7 + \\ p*p*p*C_1*C_4*C_7*G_7 + p*p*p*p*C_1*C_4*C_7*C_9\end{array}} \quad (31)$$

The invention is not limited to the embodiments shown herein. The general and special first-order and higher-order filter arrangements shown herein may be arranged in series, as required, in order to create other filter arrangements having different characteristics. For this reason some filter arrangements are provided with cross connections at their output sides in order to preclude changes in polarity when these filter arrangements are connected in series.

As will be apparent from the description, the invention is by no means limited to a specific integration process technology, such as for example MOS technology.

As already stated in the foregoing, the invention is not limited to fourth-order filter arrangements. Proceeding from the method as proposed by the invention those skilled in the art will be able to design any desired higher-order filter arrangement.

What is claimed is:

1. A filter arrangement comprising a first balanced amplifier having a non-inverting and an inverting input and having a non-inverting and an inverting output, a first and a second input terminal, a first and a second output terminal, a first and a second feedback circuit, each comprising a first capacitor, the first feedback circuit being coupled between the inverting output and the non-inverting input of the first amplifier, the second feedback circuit being coupled between the non-inverting output and the inverting input of the first amplifier, a first and a second input circuit, each comprising a parallel arrangement of a first resistor and a second capacitor, the first input circuit being coupled between the first input terminal and the non-inverting input of the first amplifier and the second input circuit being coupled between the second input terminal and the inverting input of the first amplifier, a connection between the inverting output of the first amplifier and the second output terminal and a connection between the non-inverting output of the first amplifier and the first output terminal, a third and a fourth input circuit, each comprising a third capacitor, the third input circuit being coupled between the first input terminal and the inverting input of the first amplifier, and the fourth input circuit being coupled between the second input terminal and the non-inverting input of the first amplifier.

2. A filter arrangement as claimed in claim 1, which comprises a first and a second coupling circuit, each comprising a second resistor, the first coupling circuit being coupled between the non-inverting input of the first amplifier and the inverting output of the first amplifier, and the second coupling circuit being coupled between the inverting input of the first amplifier and the non-inverting output of the first amplifier.

3. A filter arrangement as claimed in claim 2, wherein the capacitance values of the second capacitors in the first and the second input circuit are substantially zero, the capacitance values of the third capacitors in the third and the fourth input circuit and the first capacitors in the first and the second feedback circuit are substantially equal, and in that the conductance values of the first resistors in the first and second input circuit and the second resistors in the first and the second coupling circuits are substantially equal.

4. A filter arrangement as claimed in claim 2, wherein the conductance values of the first resistors in the first and the second input circuit are substantially zero, and in that the capacitance values of the third capacitors in the third and the fourth input circuit are substantially zero.

5. A filter arrangement as claimed in claim 1, which also comprises a second balanced amplifier having a non-inverting and an inverting input and having a non-inverting and an inverting output, a fifth and a sixth input circuit, each comprising a fourth capacitor, the fifth input circuit being coupled between the first input terminal and the non-inverting input of the second amplifier and the sixth input circuit being coupled between the second input terminal and the inverting input of the second amplifier, a seventh and an eighth input circuit, each comprising a third resistor, the seventh input circuit being coupled between the non-inverting output of the first amplifier and the non-inverting input of the second amplifier, and the eighth input circuit being coupled between the inverting output of the first amplifier and the inverting input of the second amplifier, a third and a fourth feedback circuit, each comprising a fifth capacitor, the third feedback circuit being coupled between the inverting output and the non-inverting input of the second amplifier and the fourth feedback circuit being coupled between the non-inverting output and the inverting input of the second amplifier, a first and second coupling circuit, each comprising a second resistor, the first coupling circuit being coupled between the non-inverting input of the first amplifier, and a first node, and the second coupling circuit being coupled between the inverting input of the first amplifier and a second node, a third and a fourth coupling circuit, each comprising a fourth resistor, the third coupling circuit being coupled between the first node and the non-inverting input of the second amplifier, and the fourth coupling circuit being coupled between the second node and the inverting input of the second amplifier.

6. A filter arrangement as claimed in claim 5, wherein the first node and the inverting output of the second amplifier and a fourth output terminal are interconnected, and in that the second node and the non-inverting output of the second amplifier and a third output terminal are interconnected.

7. A filter arrangement as claimed in claim 6, wherein the capacitance values of the second capacitors in the first and the second input circuit, of the third capacitors in the third and the fourth input circuit, and of the fourth capacitors in the fifth and the sixth input circuit are substantially zero.

8. A filter arrangement as claimed in claim 6, wherein the conductance values of the first resistors in the first and the second input circuit are substantially zero, and in that the capacitance values of the third capacitors in the third and the fourth input circuit are substantially zero.

9. A filter arrangement as claimed in claim 6, wherein that the capacitance values of the second capacitors in the first and the second input circuit and of the third capacitors in the third and the fourth input circuit are substantially zero.

10. A filter arrangement as claimed in claim 6, wherein in the capacitance values of the second capacitors in the first and the second input circuit are substantially zero, the conductance values of the first resistors in the first and second input circuit and of the second resistors in the first and the second coupling circuit are substantially equal, the conductance values of the third resistors in the seventh and the eighth input circuit and of the fourth resistors in the third and the fourth coupling circuit are substantially equal, the capacitance value of the third capacitors in the third and the fourth input circuit and of the first capacitors in the first and the second feedback circuit are substantially equal, and the capacitance values of the fourth capacitors in the fifth and the sixth input circuit and of the fifth capacitors in the third and the fourth fedback circuit are substantially equal.

11. A filter arrangement as claimed in claim 6, wherein the conductance values of the first resistors in the first and second input circuit are substantially zero and the capacitance values of the third capacitors in the third and the fourth input circuit and of the fourth capacitors in the fifth and the sixth input circuit are substantially zero.

12. A filter arrangement as claimed in claim 5, which also comprises a third balanced amplifier having a non-inverting and an inverting input and having a non-inverting and an inverting output, a fifth and a sixth output terminal, a ninth and a tenth input circuit, each comprising a sixth capacitor, the ninth input circuit being coupled between the first input terminal and the non-inverting input of the third amplifier, and the tenth input circuit being coupled between the second input terminal and the inverting input of the third amplifier, an eleventh and a twelfth input circuit, each comprising a seventh capacitor, the eleventh input circuit being coupled between the first input terminal and the inverting input of the third amplifier, and the twelfth input circuit being coupled between the second input terminal and the non-inverting input of the third amplifier, a thirteenth and a fourteenth input circuit, each comprising a fifth resistor, the thirteenth input circuit being coupled between the inverting output of the second amplifier and the inverting input of the third amplifier, and the fourteenth input circuit being coupled between the non-inverting output of the second amplifier and the non-inverting input of the third amplifier, a fifth and a sixth coupling circuit, each comprising a sixth resistor, the fifth coupling circuit being coupled between the first node and the non-inverting input of the third amplifier, and the sixth coupling circuit being coupled between the second node and the inverting input of the third amplifier, a fifth and a sixth feedback circuit, each comprising an eighth capacitor, the fifth feedback circuit being coupled between the non-inverting input and the inverting output of the third amplifier, and the sixth feedback circuit being coupled between the inverting input and the non-inverting output of the third amplifier, and the inverting output of the third amplifier is connected to the sixth output terminal and the non-inverting output of the third amplifier is connected to the fifth output terminal.

13. A filter arrangement as claimed in claim 12, wherein the first node is connected to the inverting output of the third amplifier and the second node is connected to the non-inverting output of the third amplifier.

14. A filter arrangement as claimed in claim 13, wherein the capacitance values of the second capacitors in the first and second input circuit, of the third capacitors in the third and the fourth input circuit, of the fourth capacitors in the fifth and the sixth input circuit, of the sixth capacitors in the ninth and tenth input circuit, and of the seventh capacitors in the eleventh and the twelfth input circuit are substantially zero.

15. A filter arrangement as claimed in claim 13, wherein the conductance values of the first resistors in the first and the second input circuit are substantially zero, and in that the capacitance values of the third capacitors in the third and the fourth input circuit and of the seventh capacitors in the eleventh and the twelfth input circuit are substantially zero.

16. A filter arrangement as claimed in claim 13, wherein the conductance values of the first resistors in the first and the second input circuit and of the fifth resistors in the thirteenth and the fourteenth input circuit are substantially equal, in that the product of the capacitance values of the second capacitors in the first and the second input circuit and of the fourth capacitors in the fifth and the sixth input circuit is substantially equal to the product of the capacitance values of the fifth capacitors in the third and the fourth feedback circuit and of the sixth capacitors in the ninth and the tenth input circuit, and in that the capacitance values of the third capacitors in the third and the fourth input circuit and of the seventh capacitors in the eleventh and the twelfth input circuit are substantially zero.

17. A filter arrangement as claimed in claim 13, wherein the conductance values of the first resistors in the first and the second input circuit and of the second resistors in the first and the second coupling circuit are substantially equal, in that the conductance values of the third resistors in the seventh and the eighth input circuit and of the fourth resistors in the third and the fourth coupling circuit are substantially equal, in that the conductance values of the fifth resistors in the thirteenth and the fourteenth input circuit and the sixth resistors in the fifth and of the sixth coupling circuit are substantially equal, in that the capacitance balues of the second capacitors in the first and the second input circuit and of the sixth capacitors in the ninth and the tenth input circuit are substantially zero, in that the capacitance values of the third capacitors in the third and the fourth input circuit and of the first capacitors in the first and the second feedback circuit are substantially equal, in that the capacitance values of the fourth capacitors in the fifth and the sixth input circuit and of the fifth capacitors in the third and the fourth feedback circuit are substantially equal, and in that the capacitance values of the seventh capacitors in the eleventh and the twelfth input circuit and of the eighth capacitors in the fifth and in the sixth feedback circuit are substantially equal.

18. A filter arrangement as claimed in claim 12, which also comprises a fourth balanced amplifier having a non-inverting input and an inverting input and having a non-inverting output and an inverting output, a seventh and an eighth output terminal, a fifteenth and a sixteenth input circuit, each comprising a ninth capacitor, the fifteenth input circuit being coupled between the first input terminal and the non-inverting input of the fourth amplifier and the sixteenth input circuit being coupled between the second input terminal and the inverting input of the fourth amplifier, a seventeenth and an eighteenth input circuit, each comprising a seventh resistor, the seventeenth input circuit being coupled between the non-inverting output of the third amplifier and the non-inverting input of the fourth amplifier, and the eighteenth input circuit being coupled between the inverting output of the third amplifier and the inverting input of the fourth amplifier, a seventh and an eighth feedback circuit, each comprising a tenth capacitor, the seventh feedback circuit being coupled between the non-inverting input and the inverting output of the fourth amplifier, and the eighth feedback circuit being coupled between the inverting input and the non-inverting output of the fourth amplifier, a ninth and a tenth feedback circuit, each comprising an eighth resistor, the ninth feedback circuit being coupled between the non-inverting input and the invertint output of the fourth amplifier, and the tenth feedback circuit being coupled between the inverting input and the non-inverting output of the fourth amplifier, and the inverting output of the fourth amplifier is connected to the eighth output terminal and the non-inverting output of the fourth amplifier is connected to the seventh output terminal.

19. A filter arrangement as claimed in claim 18, wherein the capacitance values of the second capacitors in the first and the second input circuit, of the third capacitors in the third and the fourth input circuit, of the fourth capacitors in the fifth and the sixth input circuit, the sixth capacitors in the ninth and the tenth input circuit, of the seventh capacitors in the eleventh and the twelfth input circuit, and of the ninth capacitors in the fifteenth and the sixteenth input circuit are substantially zero.

20. A filter arrangement as claimed in claim 18, wherein the conductance values of the first resistors in the first and the second input circuit are substantially zero and the capacitance values of the third capacitors in the third and the fourth input circuit and of the seventh capacitors in the eleventh and the twelfth input circuit are substantially zero.

21. A filter arrangement as claimed in claim 18, wherein the conductance values of the first resistors in the first and the second input circuit and of the second resistors in the first and the second coupling circuit are substantially equal, the conductance values of the third resistors in the seventh and the eighth input circuit and of the fourth resistors in the third and the fourth coupling circuit are substantially equal, the conductance values of the fifth resistors in the thirteenth and the fourteenth input circuit and of the sixth resistors in the fifth and the sixth coupling circuit are substantially equal, the conductance values of the seventh resistors in the seventeenth and the eighteenth input circuit and of the eighth resistors in the ninth and the tenth feedback circuit are substantially equal, in that the capacitance values of the third capacitors in the third and the fourth input circuit and the of first capacitors in the first and the second feedback circuit are substantially equal, the capacitance values of the fourth capacitors in the fifth and the sixth input circuit and of the fifth capacitors in the third and the fourth feedback circuit are substantially equal, the capacitance values fo the seventh capacitors in the eleventh and the twelfth input circuit and of the eighth capacitors in the fifth and the sixth feedback circuit are substantially equal, the capacitance values of the ninth capacitors in the fifteenth and the sixteenth input circuit and the of tenth capacitors in the seventh and the eighth feedback circuit are substantially equal, and the capacitance values of the second capacitors in the first and the second input circuit and of the sixth capacitors in the ninth and the tenth input circuit are substantially zero.

* * * * *